United States Patent [19]

Haque

[11] Patent Number: 4,580,065

[45] Date of Patent: Apr. 1, 1986

[54] SINGLE-SHOT CIRCUIT HAVING PROCESS INDEPENDENT DUTY CYCLE

[75] Inventor: Yusuf A. Haque, San Jose, Calif.

[73] Assignee: American Microsystems, Inc., Santa Clara, Calif.

[21] Appl. No.: 518,606

[22] Filed: Jul. 29, 1983

[51] Int. Cl.$^4$ .......................................... H03K 3/023
[52] U.S. Cl. .................... 307/273; 307/265; 307/279; 307/494; 307/597
[58] Field of Search ............... 307/443, 491, 494, 497, 307/359, 246, 573, 575, 577, 265, 273, 279, 591, 594, 597, 601, 603, 605, 296 A; 328/58, 74, 11, 129.1

[56] References Cited

U.S. PATENT DOCUMENTS

| | | | |
|---|---|---|---|
| 3,820,029 | 6/1974 | McKinley | 307/265 X |
| 4,015,145 | 3/1977 | Stewart | 307/265 X |
| 4,217,505 | 8/1980 | Aoki et al. | 307/273 |
| 4,245,167 | 1/1981 | Stein | 307/273 X |
| 4,293,781 | 10/1981 | Yamada et al. | 307/273 |

OTHER PUBLICATIONS

Weil, "Feedback Triggers One-Shot From Both Polarity Edges", *Electronics*, Jul. 1970, p. 87.

*Primary Examiner*—Stanley D. Miller
*Assistant Examiner*—D. R. Hudspeth
*Attorney, Agent, or Firm*—Steven F. Caserza; Alan H. MacPherson; Kenneth E. Leeds

[57] ABSTRACT

A single-shot circuit is fabricated as an integrated circuit except for a single capacitor requiring a single pin to connect to the on-chip circuitry. The single-shot is rendered independent of process variations and operating conditions by incorporating an analog feedback loop. The output of the single shot is detected by an analog circuit which includes a positive and negative voltage generator the ratio of whose voltages is a function of the desired duty cycle. The generators are actuated, respectively, when a pulse exists and when there is no pulse. The analog feedback circuit also includes an integrator for receiving and integrating the positive and negative voltages from the generators. The integrated and amplified voltages are fed back to the last stage of the single-shot circuit. When the duty cycle is high, the voltage that is fed back drives the single shot circuit to reduce the pulse width. When the duty cycle is low, the voltage that is fed back drives the single-shot circuit to increase the pulse width. Thus, the pulse width of the single shot is controlled by the built-in values of the positive and negative voltage generators and is independent of process variations and operating conditions.

19 Claims, 16 Drawing Figures

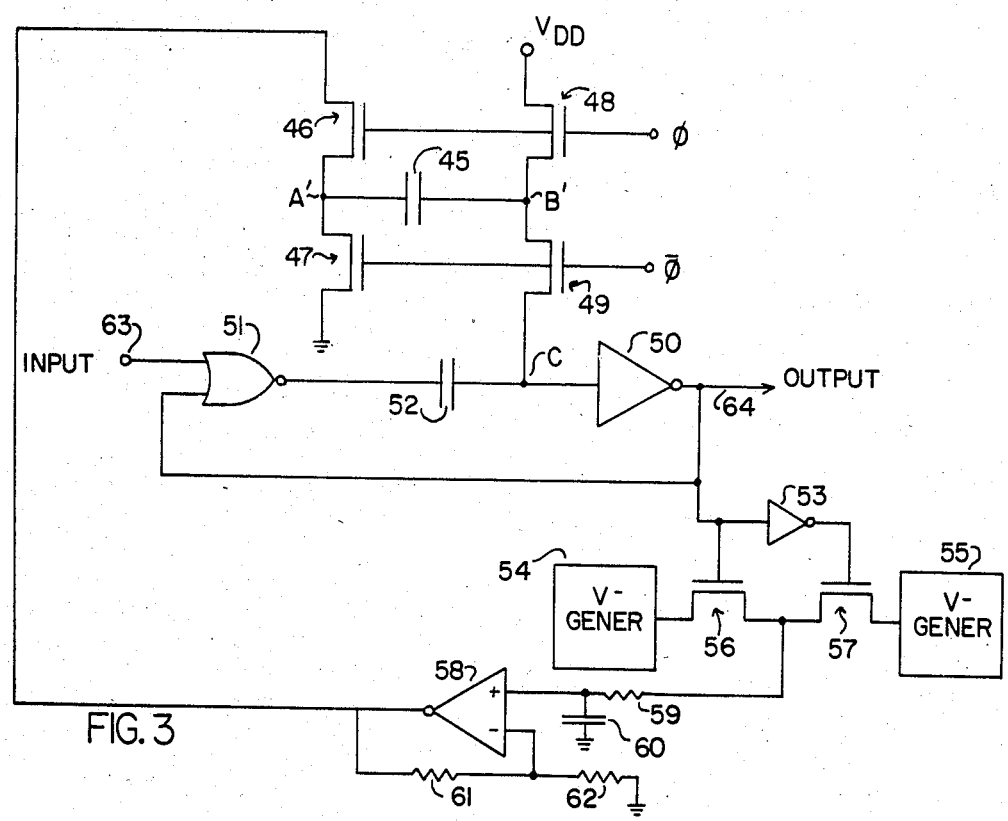
FIG. 3
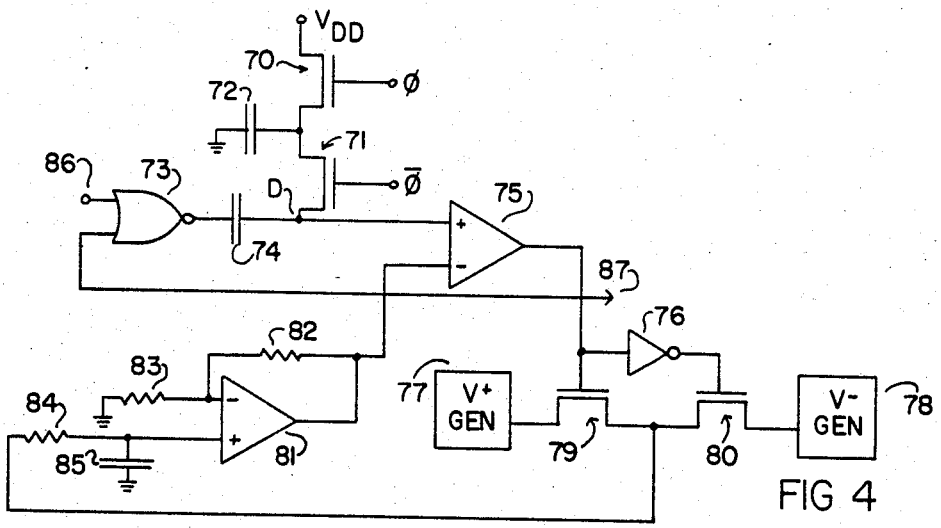
FIG 4
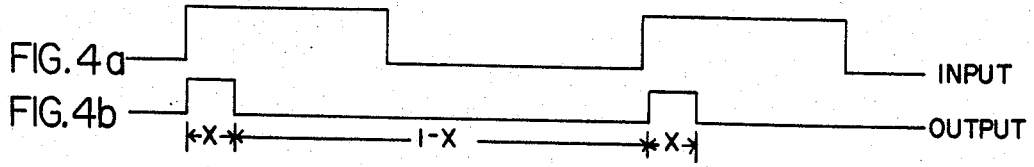
FIG.4a — INPUT
FIG.4b — OUTPUT

SINGLE-SHOT CIRCUIT HAVING PROCESS INDEPENDENT DUTY CYCLE

This invention relates to a single-shot circuit for producing a pulse of specified width upon receipt of a triggering pulse and, more particularly, relates to a single-shot circuit fabricated as an integrated circuit which is independent of variations in processing and operating conditions.

Circuits for producing pulses of specified width (so-called single shots or one shots) are well known in the art. See, for example, "Oscillator (Pulse-Generator) Design in Applications of Digital and Linear ICs", p. 24 et. seq., McGraw Hill, 1978, and the prior art in FIG. 1. As shown in the timing diagrams of FIGS. 1a–1c, which illustrate the operation of the prior art single shot of FIG. 1, a pulse is established on line 21 at the output of inverter 10 in response to a triggering input on one of the inputs to NOR gate 14. This pulse is of width $P_w$, and is shown in FIG. 1c. It is generated in response to a triggering pulse illustrated in FIG. 1b. Such single shots are widely used to generate timing pulses of arbitrary pulse width. Pulse height is not a critical parameter so long as minimum amplitudes are obtained so the pulses may be used in the circuit. In the past, single shots have been produced by interconnecting individual components.

Semiconductor process specifications allow a range for the allowable values of basic electrical properties such as threshold voltage, mobility, resistance per unit dimension and the like. Thus, within a manufacturable MOS process, it is acceptable to have the threshold voltages of individual transistors range, for example from about .9 volts to about 1.5 volts. There will be a similar allowable range for mobility values and for values of resistances per unit dimension. These variations will be encountered from wafer to wafer and experienced in devices at different locations across a wafer. In the business of manufacturing semiconductor components, all individual transistors and all operable circuits incorporating and interconnecting transistors must be operable for any electrical characteristics or combination of characteristics that is obtained within the allowable range. Thus, a given circuit employing a number of MOS transistors must function even if certain of the transistors have thresholds at the lower end of the range, other transistors have thresholds in the middle of the range, and still other transistors have threshold values at the upper end of the range. This must occur even if mobilities, resistivities, etc., vary over the allowable range. All or most permutations must result in operational devices and circuits, even if optimum operability is not obtained, within the whole range of allowable values.

It has been found that single shots fabricated in integrated circuit format will function, although not necessarily optimally, as process variations produce different values for certain electrical properties of individual transistors. The effect of process variations on the performance of a conventional one shot may be understood by considering the operation of the prior art of FIG. 1. A triggering pulse, shown in FIG. 1a, is introduced at input 9 of NOR gate 14. NOR gate 14 then opens, discharging capacitor 15 which had previously been charged by continuous current $i_w$. This lowers the voltage on the input to inverter 10, shown in FIG. 1b, thereby producing the output pulse on line 21, shown in FIG. 1c. Since the supply current $i_w$ is being continuously supplied, capacitor 15 begins to recharge as soon as the triggering pulse has passed and NOR gate 14 has closed, thereby raising the voltage on the input to inverter 10. When voltage $V_{th}$ is reached, the invertor output goes low again. As shown in FIG. 1b, when the threshold voltage $V_{th}$ is exceeded, the output of the inverter goes to zero as shown in FIG. 1c and the trailing edge of the pulse is defined. Therefore, the pulse width, $P_w$ is affected by the threshold level $V_{th}$. If due to process variations, $V_{th}$ is at the high end of the range of allowable values, it will take longer for this threshold level to be reached and the pulse width $P_w$ will be greater. If $V_{th}$ is at the low end of the allowable range of threshold voltages, this threshold level will be reached sooner and $P_w$ will be less. In practice, it has been found that the pulse width $P_w$ will vary by as much as 300%, even though the threshold voltage stays within the allowable range. The capacitance of capacitor 15 also directly affects the pulse width of the circuit. If the capacitance of capacitor 15 is greater then it will take longer for the capacitor to be recharged by a constant current $i_w$, thereby increasing the pulse width. Finally, the magnitude $i_w$ of the current that is continuously being supplied to recharge capacitor 15, will have a value that is process dependent, e.g., dependent upon the value of resistor 20. This results from the fact that impression of a $V_{zener}$ of, for example, six volts on operational amplifier 18 places six volts on the drain of transistor 17. The current through resistor 20 will therefore be $$\frac{6\ \text{volts}}{R_{20}}$$

This current also flows through transistor 16 and is mirrored and scaled through transistor 12 to produce $i_w$ upon the application of a 60 Hz clocking pulse on transistor 13 in synchronization with the triggering pulse input to inverter 10.

In each case described in the preceeding paragraph, there is a functioning one shot. But the duty cycle of the one shot may vary widely, depending upon process variations or upon operating conditions. For example, variations in temperature during operation also affects the aforedescribed threshold voltages, capacitances and resistances.

An attempt to obtain a constant duty cycle for a one-shot by using a feedback loop is suggested in the prior art; see H. P. D. Lanyon, "One-Shot with Feedback Loop Maintains Constant Duty Cycle", Electronics, July 24, 1975, p. 93. A feedback loop utilizes a single settable reference voltage and the available high and low circuit logic levels to specify the duty cycle. The circuit is not readily integrable as it requires large value capacitances and resistances; if it were integrated, at least two pins would need to be dedicated to interfacing with the external components. Also, variations in duty cycle would be caused by variations in logic output levels. Variation in power supply voltage will also cause variations in duty cycle.

It is therefore an object of the present invention to provide a circuit for producing a single shot which may be fabricated as an integrated circuit and which is process independent.

It is a further object of the present invention to provide a circuit for producing a single shot in a semiconductor chip whose operation is not dependent on operating temperature.

It is also an object of the present invention to provide a circuit for producing a single shot in a semiconductor chip where operation requires at most one external capacitor and requires at most one pin of the package encapsulating the chip.

It is another object of the present invention to provide a single-shot circuit for monolithic implementation which has a duty cycle that can be determined within a range of a few percent rather than a few hundred percent.

It is yet another object of the present invention to provide a circuit for producing a digital pulse which uses an analog feedback loop to stabilize the duty cycle at a predetermined value.

It is a further object of the present invention to provide a single shot device having an analog feedback loop employing a positive voltage generator and a negative voltage generator the ratio of whose voltages are a function of the desired duty cycle.

A BRIEF DESCRIPTION OF THE DRAWINGS

For a more complete understanding of the single-shot circuit of the present invention, reference may be had to the accompanying drawings which are incorporated herein by reference and in which:

FIG. 3 is a circuit schematic of another embodiment of the single shot circuit of the present invention;

FIG. 4 is a circuit schematic of another embodiment of the single shot circuit of the present invention;

FIGS. 4a–4b are timing diagrams, respectively, of the triggering pulse and the output pulses for the circuit of FIG. 4;

SUMMARY OF THE INVENTION

A single-shot circuit is fabricated as an integrated circuit and rendered independent of process variations and operating conditions by incorporating an analog feedback loop. The output of the single shot is detected by an analog circuit which includes a positive and negative voltage generator the ratio of whose voltages is a function of the desired duty cycle. The generators are actuated, respectively, when a pulse exists and when there is no pulse. The analog feedback circuit also includes an integrator for receiving and integrating the positive and negative voltages from the generators. The integrated and amplified voltages are fed back to the last stage of the single-shot circuit. When the duty cycle is high, the voltage that is fed back drives the single shot circuit to reduce the pulse width. When the duty cycle is low, the voltage that is fed back drives the single-shot circuit to increase the pulse width. Thus, the pulse width of the single shot is controlled by the built-in values of the positive and negative voltage generators.

DESCRIPTION OF THE PREFERRED EMBODIMENTS

Figure 1:
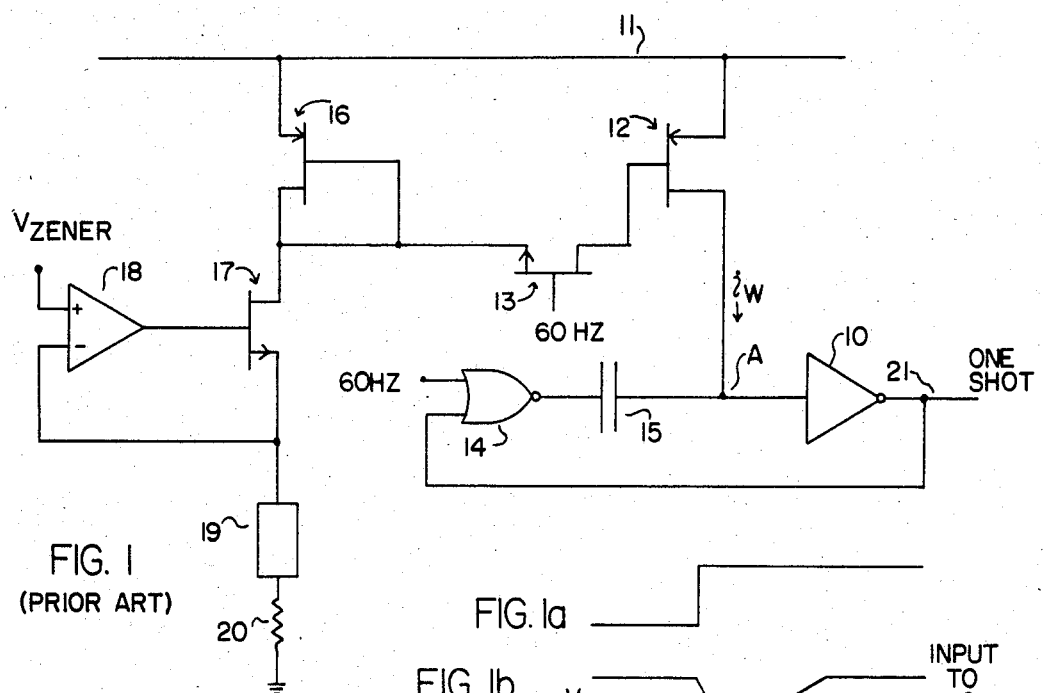
FIG. 1 is a circuit schematic of a single-shot circuit of the prior art.
Figure 1A:
FIGS. 1a–1c are timing diagrams, respectively, of a 60-cycle reference clock, a triggering signal and an output pulse.
Figure 1B:
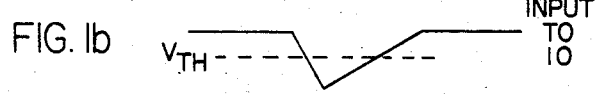
Figure 1C:
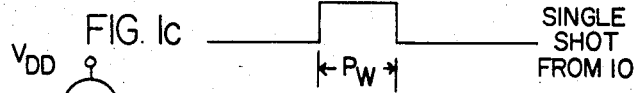

The function of a one-shot circuit is to provide a pulse upon receipt of a triggering signal. A standard prior art configuration is shown in FIG. 1. As long as NOR gate 14 is turned off, the current $i_w$ will charge capacitor 15. So long as capacitor 15 provides a voltage above the threshold voltage level of transistors in inverter 10, then the output of inverter 10 is low and no pulse is produced. Upon receipt of a triggering pulse on line 9, NOR gate 14 will conduct, thereby discharging capacitor 15. With only a momentary delay, see FIGS. 1a and 1b, the voltage at node A and thus at the input of inverter 10, will drop below the threshold level of the inverter 10. Inverter 10 will then have a high output and a pulse shown in FIG. 1c, is produced on line 21. After being discharged, capacitor 15 begins to recharge as it receives the current $i_w$. The voltage on node A and thus on the input to inverter 10 rises monotonically until it exceeds the threshold $V_{th}$ of the inverter 10. Thereupon, the inverter output goes low. This point in time defines the trailing edge of the pulse and therefore the pulse width $P_w$, shown in FIG. 2c. The current $i_w$ is produced by conventional means as described previously.

Thus, the current $i_w$ is available to recharge node A upon the occurrence of the 60-cycle pulse, e.g., upon the triggering of the one-shot circuit and the discharge of capacitor 15. Once the pulse disappears, e.g., after capacitor 15 is fully charged, the current $i_w$ is no longer needed or provided since transistor 13 is gated off. As described in detail above, the $V_{th}$ values for the transistors in inverter 10, the capacitance of capacitor 15, the value of resistor 20, as well as other inherent electrical properties of active and passive components, are process sensitive and affect the performance of the single shot.

With the use of a feedback loop, a one-shot may be provided with a stable duty cycle as suggested in H. P. D. Landon, "One-Shot with Feedback Loop Maintains Constant Duty Cycle", Electronics, July 24, 1975, p. 93. However, for a viable circuit in an integrated format, the components, or most of them must be integrable (i.e., have component values that can be achieved on chip) and the resulting circuit operation should also be process independent as well as independent of operating conditions such as power supply performance and temperature. The deficiencies of this prior art approach, as contrasted with the advantages of the circuit of the present invention, will be discussed in conjunction with the ensuing description of the present invention.

As integrated circuits have become increasingly more complex, the need has arisen to fabricate both digital and analog circuitry on the same chip using the same technology. This has resulted in implementation of many analog functions in MOS technology. See, e.g., P. R. Gray, et al, "MOS Operational Amplifier Design—A Tutorial Overview", *IEEE Journal of Solid-State Circuits*, V.SC-17, p. 969, December 1982. The present invention accomplishes such a hybridization and includes functions of both the digital type, i e., the single-shot circuit, and of the analog type, i.e., the analog feedback loop.

The process dependence of the various components, as described above, cannot be overcome in a conventional circuit arrangement. Only with the provision of an active feedback loop, as with the present invention, can the peculiarities of a one shot, as fabricated, be continuously adjusted during operation to provide the desired duty cycle. However, this feedback loop must be implemented in accordance with the present invention to minimize power supply dependence and to permit substantial on-chip integration. As an added benefit for the circuit of the present invention, variations in device performance which occur due to changes in the environment, such as temperature, are not allowed to produce an undesired duty cycle. The present invention uses a pair of voltage generators the ratio of whose output voltages is chosen to reflect the desired duty cycle. The duty cycle is defined as, i.e., the ratio of the time the pulse logic state is "1" compared to the full period between the initiation of pulses. The duty cycle will always be a number between zero and one. A composite voltage representing the duty cycle is readily susceptible to being uniquely produced by the pair of voltage generators as described in detail subsequently with reference to FIG. 2.

Figure 2:
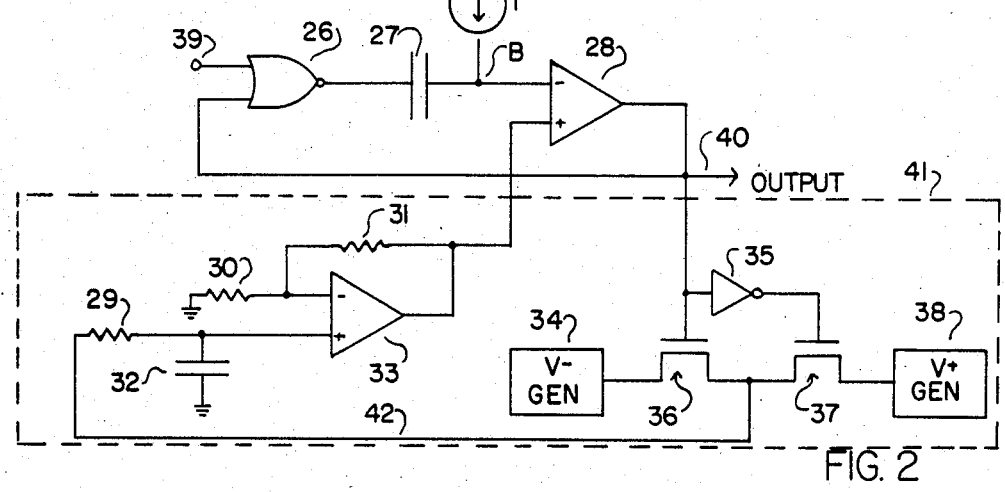
FIG. 2 is a circuit schematic of one embodiment of the circuit of the present invention.

In FIG. 2, a circuit embodiment in accordance with the present invention is shown. The one-shot consists of NOR gate 26 whose output is connected to one terminal of capacitor 27 whose other terminal is connected to the negative input of operational amplifier 28. When a triggering pulse is received on input 39 of NOR gate 26, the output of operational amplifier 28 is a one-shot pulse delivered on line 40. The output of operational amplifier 28 is fed back into the other input of NOR gate 26. A constant current source delivers a current i to charge node B which will be intermittantly discharged by the receipt of a pulse on the input 39 to NOR gate 26. Thus, the pulse width is determined by the time it takes from receipt of the triggering pulse which defines initiation of the pulse until the capacitor 27 recharges sufficiently to raise the voltage on the negative input to operational amplifier 28 to the level that turns it off. In accordance with the present invention, this turnoff level is adjusted by the analog feedback loop shown within a dotted line 41. This adjustment ensures that the pulse train on output line 40 has the desired duty cycle. In the embodiment illustrated the analog feedback loop 41 consists of voltage generation means 35, 34, 36 and 38, 37, integrator 29, 32 and amplifier 33, 30, 31. V− voltage generator 34 and V+ generator 35 are designed in accordance with the discussion below so that their output voltage ratios are proportional to the duty cycle desired. During the time that a pulse is appearing on output line 40, the gate of transistor 36 will experience a high signal and thus will conduct the negative voltage from the V− generator 34. The inverter 35 will have a low output during the time that there is a high level on output line 40 so that the gate of transistor 37 experiences a low signal and will be nonconductive. So long as the high level continues, a negative voltage is held on line 42 and integrated on the integrator network consisting of resistor 29 and capacitor 32. When the pulse on output line 40 goes low, the output of inverter 35 goes high, thereby placing a high voltage on the gate of transistor 37. At this point the V+ generator 38 sends its positive voltage onto line 42 to be integrated by integrator network 29, 32. During this period, the gate of transistor 36 is low and V− generator 34 makes no contribution to the voltage on line 42. This integrated signal is amplified in amplifier 33 and fed back to the positive terminal of operational amplifier 28. The amplification is set by resistors 30 and 31.

A feedback signal directly proportional to the instantaneous or nominal duty cycle, is used as described above to adjust the threshold level of operational amplifier 28. If the actual or nominal pulse width is too long for the specified duty cycle, X, then V− generator 34 will be on more of the time than if the duty cycle were precisely at the value of X. Thus, the integrated signal will be more negative and after amplification will provide a more negative input to operational amplifier 28. This will lower the threshold, cause the operational amplifier to turn off sooner and reduce the duty cycle. Conversely, should the active duty cycle be lower than X then the amount of time that the inverter 35 has a low input will increase. Thus, transistor 37 will conduct more of the time and the positive voltage will be received from voltage generator 38 on line 42 and integrated on the network of resistor 29 and capacitor 32 for longer periods. After amplification, this will result in a more positive input to the positive terminal of operational amplifier 28. This will tend to increase the pulse width since it will take longer for the threshold level of operational amplifier 28 to be reached. This will result in a longer time for the charging of the node B. The self-adjusting feature of the feedback loop will come into play until stable operation is achieved, i.e., until the actual duty cycle is at the value of the desired duty cycle. Should a pulse be slightly longer than specified, the next pulse would be shorter. If the pulse is still too long, then the next pulse will be shorter. The length of each succeeding pulse will be shorter still until it reaches the desired pulse width, i.e., until the desired duty cycle is achieved. There will be continuous compensation as temperature varies. For process variations which offset the performance of the single shot, an adjustment will be made quickly and held. For environmentally induced variations, there will be continuous compensation as temperature varies. Thus, the present invention provides a continuous adjustment for such variations that would otherwise affect device performance.

Referring to FIG. 2, once stable operation has been achieved, the output of amplifier 33 is the long term average of the V+, V− output and should not change. Net current flowing into capacitor 32 is zero. If X is the duty cycle (high for X% of the time on output line 40), then $$\frac{(V_{32} - V-)X}{R_{29}} = \frac{(V+ - V_{32})(1 - X)}{R_{29}}$$

or $$X = \frac{V+}{V+ - V-} - \frac{V_{32}}{V+ - V-}$$

In the above equation V− is assumed to be negative so that the denominator is the sum of the absolute voltages V+/and/V−/.

Figure 5:
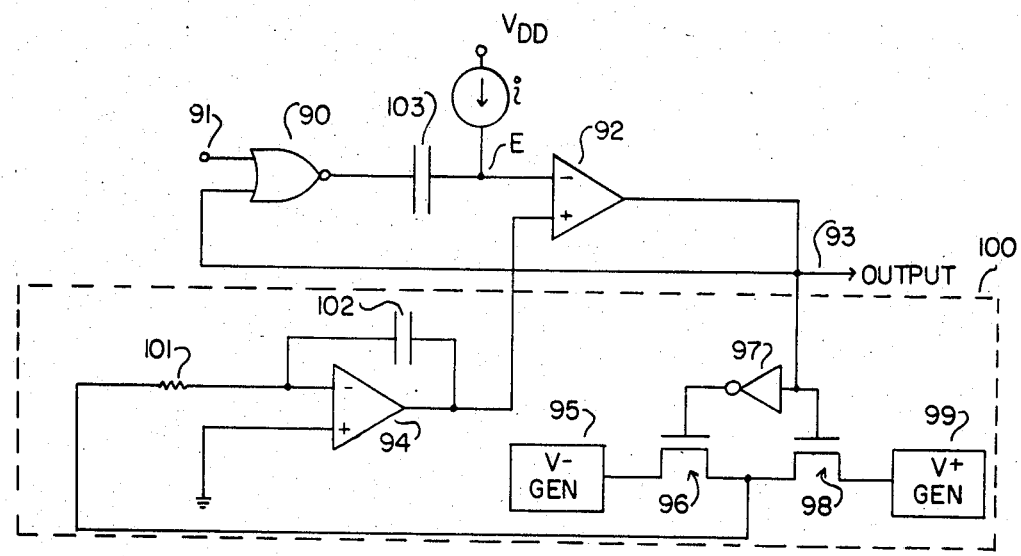
FIG. 5 is a circuit schematic of still another embodiment of the single-shot circuit of the present invention.

The second term can be made negligible by setting amplifier 33 to a high gain. Thus, the duty cycle will effectively be given by the term:

$$X = \frac{V+}{V+ - V-}$$

is a ratio of V+ to the sum of V+ and V−. The second term, $$\frac{V_{32}}{V+ - V-},$$

can be totally eliminated by
using the approach shown in FIG. 5 since the equivalent of $V_{32}$ is zero. This, however, requires an added pin on the IC which is not always available, and is expensive. A more convenient method is to reduce the value of $$\frac{V_{32}}{V+ - V-}$$

using a large gain; preferrably, a gain greater than 10 is used.

Figure 7A:
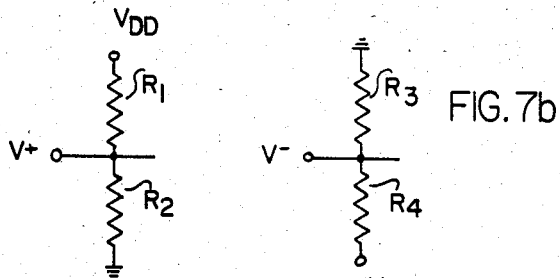
FIGS. 7a and 7b are schematic diagrams of another resistor means for generating V+ and V−.
Figure 7B:
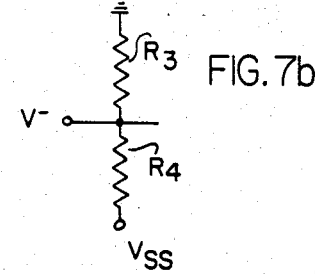

The voltage generators which generate V+ and V− can be fabricated on the chip in several ways. Most integrated circuits have on-board supply voltages $V_{DD}$, a positive voltage such as +5 volts, and $V_{SS}$, a negative voltage such as −5 volts. As seen in FIGS. 7a and 7b the positive voltage generator may simply be a tap on a voltage drop from $V_{DD}$ to ground through resistances $R_1$ and $R_2$. The V+ voltage generated would be given by $$V+ = \frac{V_{DD} R_2}{R_1 + R_2}$$

Similarly, the negative voltage generator may be a tap on a voltage drop from $V_{SS}$ to ground through resistors $R_3$ and $R_4$. The V− voltage generated would be given by $$V- = \frac{V_{SS} R_3}{R_3 + R_4}$$

Figure 6:
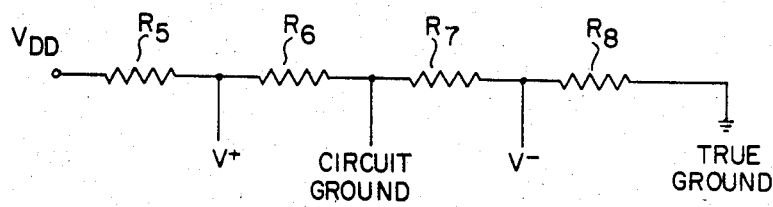
FIG. 6 is a schematic diagram of resistor means for generating V+ and V−.

Any variations in processing that would affect resistances would cancel out since $R_1$ and $R_2$ as well as $R_3$ and $R_4$ are fabricated close to each other on the chip and would have experienced nearly identical processing and therefore the ratio of $R_2$ to $R_1+R_2$ or $R_3$ to $R_3+R_4$ would be process independent. In an alternate embodiment the two supply voltages may be generated by connecting a string of four resistors from $V_{DD}$ to ground. As shown in FIG. 6, the positive voltage is a tap between resistors $R_5$ and $R_6$ while the negative voltage is a tap between resistances $R_7$ and $R_8$. If the circuit ground, i.e., the voltage level shown as ground in the circuits of FIGS. 2, 3, 4 and 5, is taken from a tap between resistors $R_6$ and $R_7$, then the value for the positive voltage is given by $$V+ = \left( \frac{R_6 + R_7 + R_8}{R_5 + R_6 + R_7 + R_8} \right) V_{DD}$$

and the value for the negative voltage is given by $$V- = \left( \frac{R_8}{R_5 + R_6 + R_7 + R_8} \right) V_{DD}$$

It can be seen that the ratio of $$\frac{V+}{V+ - V-}$$

is independent of variations in resistors and in $V_{DD}$. Thus, the effect of power supply variations on duty cycle are removed as well as variations in resistors. The two schemes for generating voltages on board the chip described above are passive.

Figure 8:
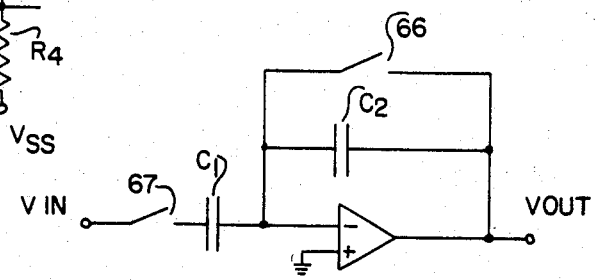
FIG. 8 is a schematic diagram of capacitive means for generating a reference voltage for use in the circuit of the present invention.

An active voltage generator can be produced using capacitors and an operational amplifier as shown in FIG. 8. Here, the voltage output is given by $$V_{OUT} = V_{IN} \frac{C_1}{C_2}$$

For on-chip voltage generators this could be $$V+ = \left( \frac{C_1}{C_2} \right) V_{DD}$$

or $$V- = \left( \frac{C_3}{C_4} \right) V_{SS}$$

As with the resistors, any variations in processing that would tend to change the values of capacitors $C_1$ and $C_2$ would be experienced equally by $C_1$ and $C_2$ and processrelated tendencies would cancel out in the above formulas. This active embodiment is less preferred than the passive approach since the switch 66 introduces an offset for the output. See, e.g., Y. Haque, et al., "Switched Capacitor Gain Stage with Offset Switch Feed - Through Cancellation Scheme", U.S. application Ser. No. 06/239,945, now issued as U.S. Pat. No. 4,404,525.

Figure 2A:
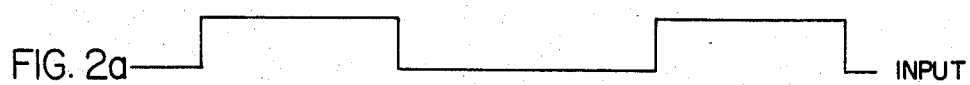
FIGS. 2a–2b are timing diagrams, respectively, of the triggering pulse and the output pulse for the circuit of FIG. 2.
Figure 2B:
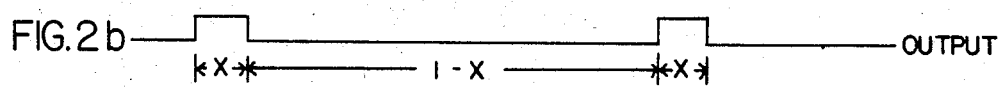

The operation of the circuit of the present invention is shown in the timing diagrams of FIGS. 2a-2b. In FIG. 2a the input on line 39 is shown as a generalized square wave pulse. In practice, it may be a spiked pulse, a pulse of irregular shape or any pulse of sufficient amplitude to turn NOR gate 26 on. What is required is that a momentary high signal is presented on input line 39 for NOR gate 26. Upon receipt of the NOR gate signal, the pulse output on line 40 is initiated, thereby signalling start of the pulse of desired width as defined by the duty cycle X, the percentage of time a pulse appears on the output. The duty cycle, X, will be determined in accordance with the values built into V− generator 34 and V+ generator 38 as these values are fed back into the single shot as discussed above. The period of time between the high period of the pulse and the initiation of the next high period pulse will be 1−x or (100−x)% of the total interval between the triggering pulses.

Another embodiment of the circuit of the present invention is illustrated in FIG. 3 which requires only one operational amplifier. Here, the single-shot generator comprises NOR gate 51 whose output is connected to capacitor 52 which provides the input to inverter 50. In operation, a pulse received on input line 63 of NOR gate 51 will produce a pulse output on line 64. The timing diagrams are essentially the same as shown above in FIGS. 2a-2b for the embodiment of FIG. 2. In this embodiment the feedback loop does not close with an operational amplifier. Instead, an inverter 50 (cheaper to implement on chip) is used to produce the pulse. The feedback is provided to the network of transistors which recharge capacitor 52. This network comprises transistors 46, 47 and 48, 49 which provide for the charging of capacitor 45 and the discharging of capacitor 45 through transistor 49 onto node C.

The clocking signals $\phi$ and $\bar\phi$ are complementary and do not overlap. When $\phi$ is high, transistors 46 and 48 are on and transistor 47 and 49 are off so that the feedback signal is impressed on capacitor 45. If the pulse width is too wide, a correction voltage is generated to shorten it as follows. Since pulse width is too wide, a net negative voltage $V_x$ appears on output of 58. When $\phi$ turn on, $C_{45}$ samples $V_x$ on one terminal and $V_{DD}$ on the other. Net charge across $C_{45} = V_x - V_{dd}$. When $\bar\phi$ turns high, node A' is discharged to ground reference. Since node B' is floating, positive transistion of node A' from negative voltage $V_x$ to ground will increase the voltage on node B' and increase the charging rate of $C_{52}$ to $V_{dd}$ causing the on time (the time output is high) of output 64 to decrease. Conversely, if the output on this is too small, the voltage transition on node A', B' is negative, thus decreasing the charging time and adjusting the duty cycle. The advantage of this schematic is that inverter 50 is easier to implement on chip (it consumes less power and silicon area) and arrangement 45-49 replaces a current source (which also consumes larger silicon area).

A further embodiment of the present invention is shown in FIG. 4. Here, the single shot operates in a manner similar to that of the embodiment of FIG. 2. An input on line 86 of NOR gate 73 serves to discharge capacitor 74. The discharge of capacitor 74 lowers the input to operational amplifier 75 and drives operational amplifier 75 to initiate a pulse output on line 87. When node D rises sufficiently above the threshold of the operational amplifier 75 as capacitor 74 recharges, the pulse is cut off. The feedback loop operates in accordance with the previous descriptions except that the polarities have been changed for both the voltage generators 77 and 78 and on the operational amplifier 75. Thus, a negative feedback loop is still achieved. If only the polarity of the voltage generators or if only the polarity of the input to the operatonal amplifier 75 were changed, then a positive feedback loop would be obtained; such a positive feedback loop will cause the circuit to be inoperable because the output will stay stuck at one voltage level. Briefly, in operation, the V+ and V− generators are designed to have a voltage such that the ratio V+/V±V− is proportional to x, the desired duty cycle. As described previously, if the pulse is too long, then proportionally more positive voltage is integrated through the integrator network of resistor 84 and capacitor 85. Should the pulse width be too short, proportionally more negative voltage is integrated as supplied by negative voltage generator 78 and transistor 80, integrator network 84, 85 and amplifier 81, 83, 82. Here the feedback is fed to the negative terminal of the operational amplifier. The self-adjusting feature is implemented with reverse polarity to the embodiment of FIG. 2 and negative feedback is yet maintained. This embodiment is unique in that it has a different means to feed a current to the node D. When $\phi$ is high, transistor 70 conducts and capacitor 72 is charged to $V_{dd}$. Since $\phi$ and $\bar\phi$ do not overlap, no current will flow through transistor 71 until $\phi$ goes low and $\bar\phi$ goes high. When $\bar\phi$ goes high, the charge stored on capacitor 72 is discharged through transistor 71 onto node D thereby charging capacitor 74. In operation, capacitor 74 remains charged until discharged by the appearance of a high triggering pulse on input line 86 of NOR gate 74. The time constant is determined by the ratio of the capacitances of capacitors 72 and 74 and the frequency of clock $\phi$. This ratio is virtually process independent. The timing diagrams of the inputs and outputs for the one shot 73, 74, 75 is given in FIGS. 6a-6b and is as described above with respect to the embodiment of FIG. 2.

An additional embodiment of the one-shot circuit of the present invention is shown in FIG. 5. In this embodiment the one-shot circuit consists of NOR gate 90 whose output is connected to one side of capacitor 103; the other side of capacitor 103 is connected to the negative input to operational amplifier 92. Upon receipt of a triggering impulse on input 91 to NOR gate 90, capacitor 103 is discharged. As node E goes low, a pulse appears on the output of operational amplifier 92. The pulse is terminated upon the recharging of node E by the current source connected to $V_{DD}$. This portion of the circuit is identical to that shown and described in FIG. 2. The analog feedback loop, within dotted line 100, however, utilizes a active integrator in its feedback loop. Thus, the time averaged negative voltage from voltage generator 95 and the positive voltage from V+ generator 99 is passed through resistor 101 and integrated in operational amplifier 94. The operational amplifier 94 is connected as an active integrator by having its positive terminal connected to ground and having a capacitor 102 tied between its output and its negative input. Since the positive input is tied to ground, it is known that the negative input must be at the same level. Thus, since one side of resistor 101 is at the ground level, there will be no voltage at that point so that the second term in the equation which defines the relationship between duty cycle and V+, V−, is not present. Thus, the duty cycle is given precisely (ignoring dc offsets) by the following term:

$$X = \frac{V_+}{V_+ - V_-}$$

Although this embodiment is more precise in its operation than the embodiment of FIG. 2, or any of the other embodiments, it is not preferred since capacitor 102 must be off the chip since it has a high rating ($\simeq 0.1\mu f$).

The amplifier 94 in FIG. 5 is built on chip. To connect capacitor 102 into the chip, two pins, the negative input and the output pin of 94, will be needed on the package holding the chip. In contrast only one pin is required for the other embodiments. For example, in FIG. 3 capacitor 60 which is external to the chip needs an access only to the positive input of amplifier 58. The ground pin is already available on the package for other uses. Also, except for capacitor 32 in FIG. 2, 60 in FIG. 3, 85 in FIG. 4, and 102 in FIG. 5, the other capacitors of all embodiments of the present invention are smaller and have values of only a few pico farads. Thus, two additional pins are required to implement configuration of FIG. 5 as opposed to one additional pin for the other embodiments.

In principle, a single shot or one shot produces a digital pulse from an arbitrary triggering pulse or analog signal with a peak above a given threshold. The circuit of the present invention utilizes an analog feedback loop of a type which is integrable on-board a semiconductor chip, is process independent and is independent of operating conditions. This feedback loop is implemented in the preferred embodiments, as discussed in detail above, by using only one additional pin. In the embodiments of FIGS. 2, 3 and 4, one terminal of the off-chip capacitor may be tied to an arbitrary external reference such as ground, thereby eliminating the need for a second pin. This feedback loop also ensures that the pulse width produces a duty cycle which is within a few percent of the desired duty cycle rather than deviating by up to a few hundred percent. Greater precision is not readily attainable due to the inherent offset voltages of operational amplifiers and the finite gain of feedback loops; fortunately, presision to within a few percent is eminently satisfactory. Various other embodiment may be implemented which utilizes different means to produce a current to recharge the capacitor in the single shot, or a different means to integrate or a different means to amplify the feedback signal.

I claim:

1. A single-shot circuit for producing a pulse of reference width upon receipt of a triggering signal comprising:
    single-shot circuit means having an input lead for receiving said triggering signal and having an output lead for providing a pulse of nominal width;
    analog feedback means connected to said output lead of said single shot circuit means, said analog feedback means including a comparison means for comparing the width of said pulse of nominal width with a desired reference pulse width and for generating an error signal, said error signal being fed back to said single-shot circuit means to produce an adjustment in said pulse of nominal width towards said desired reference pulse width.

2. A single-shot circuit in accordance with claim 1 wherein said analog feedback means comprises:
    a first voltage generator connected to said output lead of said single-shot circuit means, said first voltage generator having an output lead for generating a voltage of one polarity when a pulse is detected on said output lead of said single-shot circuit means;
    a second voltage generator connected to said output lead of said single-shot circuit menas, said second voltage generator having an output lead for generating a voltage of opposite polarity to said one polarity during the time that no pulse is detected on said output lead of said single-shot circuit means, wherein the ratio of said voltage of one polarity to said voltage of opposite polarity determines said reference pulse width; and
    integrator means connected to the output leads of said first and second voltage generators for integrating said voltages generated by said first and second voltage generators, and providing an integrated signal which is fed back to said single-shot circuit means to produce said adjustment in said pulse of nominal width towards said desired reference pulse width.

3. A single-shot circuit in accordance with claim 2 wherein said first voltage generator generates a positive voltage and said second voltage generator generates a negative voltage.

4. A single-shot circuit in accordance with claim 2 wherein said first voltage generator generates a negative voltage and said second voltage generator generates a voltage and said second voltage generator generates a positive voltage.

5. A single-shot circuit in accordance with claim 4 wherein said integrator means comprises an active integrator.

6. A single-shot circuit in accordance with claim 4 in combination with operational amplifier means, said operational amplifier means having an output lead, an inverting input lead, and having a noninverting input lead connected to receive said integrated signal for providing an amplified integrated signal, said output lead of said operational amplifier means feeding said amplified integrated signal back to said single-shot circuit means.

7. A single-shot circuit in accordance with claim 6 wherein said single-shot circuit means includes an operational amplifier and wherein said output lead of said operational amplifier means which is connected to the output lead of said integrator means is fed back to the positive input lead of said operational amplifier in said single-shot.

8. A single-shot circuit in accordance with claim 4 wherein said reference pulse width as defined by duty cycle X is given by the ratio of the absolute value of said positive voltage divided by the sum of the absolute values of said positive voltage and said negative voltage.

9. A single-shot circuit in accordance with claim 2 wherein said single-shot circuit means includes charge storage means, in combination with means to recharge said charge storage means.

10. A single-shot circuit in accordance with claim 9 wherein said means to recharge said charge storage means serves to recharge said charge storage means after a pulse is generated and said charge storage means is discharged.

11. A single-shot circuit in accordance with claim 9 wherein said means to recharge said charge storage means comprises a capacitor which is alternately charged from an available voltage through a first gating transistor and discharged into said charge storage means in said single-shot circuit means through a second gating transistor, said first gating and said second gating transistors being controlled by complementary, nonoverlapping clocking signals.

12. A single-shot circuit in accordance with claim 2 wherein said single-shot circuit means comprises:
    an inverter having an input lead and an output lead;
    means to retain a charge connected to said input lead of said inverter whereby the voltage level on said input lead to said inverter is controlled; and
    means for supplying a current connected to said means to retain a charge to thereby recharge said means to retain a charge, said means for supplying a current comprising:
    a first switch means having first and second current handling terminals and a control terminal, said first current handling terminal being connected with the output terminal of said integrator means for receiving an analog feedback signal;
    a second switch means having first current handling terminal connected to said second current handling terminal of said first switch means, a second current handling terminal connected to ground, and having a control terminal;

a third switch means having a first current handling terminal connected with a positive supply voltage, a second current handling terminal, and a control terminal;

a fourth switch means having a first current handling terminal connected to said second current handling terminal of said third switch means, a second current handling terminal connected with said means to retain a charge, and a control terminal;

a feedback capacitor having a first terminal connected to said second current handling terminal of said first switch means and a second terminal connected to said second current handling terminal of said third switch means;

a source of a first clocking signal, $\phi$, being connected to said control terminals of said first and third switch means so that when $\phi$ is high said first and third switch means are on, said second and fourth switch means are off, and said analog feedback signal is impressed on said feedback capacitor;

a source of second clocking signal, $\bar{\phi}$ being connected to said control terminals of said second and fourth switch means, said clocking signals $\phi$ and $\bar{\phi}$ being complementary and nonoverlapping whereby said feedback capacitor is charged in accordance with the potential of said analog feedback signals and said means to retain a charge is supplied a current whose value tends to adjust the high output signal appearing on said output lead of said inverter towards said reference pulse width.

13. A single-shot circuit in accordance with claim 12 wherein said means for supplying a current supplies a current to said means to retain a charge upon actuation by said clocking signals only after a pulse has been generated through said inverter and said means to retain a charge has been discharged.

14. A single-shot circuit capable of producing a pulse of a reference width upon receipt of a periodic triggering signal, comprising:

a NOR gate having two input leads and an output lead, one of said input leads being connected to the source of said triggering signal;

a capacitor having first and second leads, said first lead connected to said output lead of said NOR gate;

an output stage having and input lead connected to said second lead of said capacitor, and an output lead from said output stage being connected to the other input lead of said NOR gate, said output stage having the property of producing a high output signal on said output lead upon sensing a low voltage on said capacitor;

voltage generator means connected to an output lead of said output stage, said voltage generator means generating a voltage of one polarity and having a magnitude proportional to said reference pulse width when a pulse is detected from said output stage and further generating a voltage of the opposite polarity when no pulse is detected from said output stage; and integrator means having inverting and noninverting input leads and an output lead, said inverting input lead being connected to said voltage generator means for receiving said voltage of various polarities from said voltage generator and feeding said integrated error signal back to said output stage to adjust the actual pulse width towards said reference pulse width.

15. A single-shot circuit in accordance with claim 14 wherein said integrator means is an operational amplifier configured as an active integrator.

16. A single-shot circuit in accordance with claim 14 in combination with amplifier means connected between the output lead of said integrator means and said output stage to amplify said error signal.

17. A single-shot circuit in accordance with claim 14 wherein said output stage is an operational amplifier having and inverting input lead, a noninverting input lead, and an output lead and wherein said output lead of said amplifier means is connected to said noninverting input lead of said operational amplifier.

18. A single-shot circuit in accordance with claim 14 wherein said output stage is an inverter, and said amplifier means applies said error signal to a charge generating means, said charge generating means applying charge represenative of the difference between the instantaneously detected pulse width and the said reference pulse to the input lead to said inverter to adjust the instaneous pulse width towards said said reference pulse width.

19. A single shot circuit in accordance with claim 2 wherein said first voltage generator, said second voltage generator and said integrator means are capable of being formed as a single integrated circuit device.

* * * * *